(12) United States Patent
Chen et al.

(10) Patent No.: US 7,952,153 B2
(45) Date of Patent: May 31, 2011

(54) DIFFERENTIAL PRESSURE SENSING DEVICE AND FABRICATING METHOD THEREFOR

(75) Inventors: Jung-Tai Chen, Hsinchu (TW); Chun-Hsun Chu, Hsinchu (TW); Wen-Lo Shieh, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 700 days.

(21) Appl. No.: 11/892,240

(22) Filed: Aug. 21, 2007

(65) Prior Publication Data
US 2008/0157236 A1 Jul. 3, 2008

(30) Foreign Application Priority Data

Dec. 29, 2006 (TW) .............................. 95150069 A

(51) Int. Cl.
*H01L 29/84* (2006.01)
*H01L 21/56* (2006.01)
(52) U.S. Cl. ...................................... 257/415
(58) Field of Classification Search .............. 257/91, 257/98, 99, 100, 81, 82, 127, 170, 181, 414, 257/423–440, 484, 605, 688, E29.17, 433, 257/434, 667, 787–796, E31.117–E31.118, 257/E51.02, E23.116–E23.14, 212–413, 257/E31.054, E31.075, E31.078, E31.081, 257/E31.084, E27.154, E27.159, E27.16, 257/E27.163, E29.233, E29.234, E29.228, 257/E29.235, E29.236, E29.237, E29.238; 257/E29.239, E29.24, E21.617; 438/50, 438/52, 106, 15, 25, 26, 51, 64–67, 112, 124, 126, 127
See application file for complete search history.

(56) References Cited

U.S. PATENT DOCUMENTS

| 5,852,320 | A | * | 12/1998 | Ichihashi | 257/419 |
| 6,379,988 | B1 | | 4/2002 | Peterson et al. | |
| 2005/0186703 | A1 | * | 8/2005 | Weiblen et al. | 438/106 |
| 2005/0212109 | A1 | * | 9/2005 | Cherukuri et al. | 257/686 |
| 2006/0185429 | A1 | * | 8/2006 | Liu et al. | 73/146.5 |

FOREIGN PATENT DOCUMENTS

| TW | 423715 | 2/2001 |
| TW | I248511 | 2/2006 |
| TW | 200642054 | 12/2006 |

* cited by examiner

*Primary Examiner* — Dao H Nguyen
*Assistant Examiner* — Tram H Nguyen
(74) *Attorney, Agent, or Firm* — Birch, Stewart, Kolasch & Birch, LLP

(57) ABSTRACT

At least one differential pressure sensing device has an active surface with an active region and a back surface with a recess. Next, a sacrificial layer is formed on a surface of the active region. Then, the differential pressure sensing device is bonded and electrically coupled with a surface of a carrier that has at least one through-hole corresponding to the recess of the differential pressure sensing device. Afterwards, at least one molding compound is formed to encapsulate the carrier and differential pressure sensing device while exposing the through-hole region and an upper surface of the sacrificial layer. Then, a solvent is used to naturally decompose the sacrificial layer, such that the active region of the differential pressure sensing device is exposed to atmosphere, thereby forming a differential pressure sensing device package with the through-hole.

8 Claims, 7 Drawing Sheets though, it is necessary to further rough-cast the fibrous molding material on the second layer of sacrificial protection layer 13. Therefore, the steps for processing the fibrous molding material are increased to cause a waste of cost. Finally, the conventional art uses much sacrificial protection layer material, so the process cost is higher.

DIFFERENTIAL PRESSURE SENSING DEVICE AND FABRICATING METHOD THEREFOR

CROSS-REFERENCE TO RELATED APPLICATIONS

This non-provisional application claims priority under 35 U.S.C. §119(a) on Patent Application No(s). 095150069 filed in Taiwan, R.O.C. on Dec. 29, 2006, the entire contents of which are hereby incorporated by reference.

BACKGROUND OF THE INVENTION

1. Field of Invention

The present invention relates to a differential pressure sensing device package and a fabricating method therefor. More particularly, the present invention relates to a fabricating method of forming a space on an active region of a differential pressure sensing device in a package and a structure thereof.

2. Related Art

For current micro electromechanical system (MEMS) industry, sensing devices have inherent characteristics of being miniaturized and integrated. However, the overall cost of the device is high, so the application fields and scope of the device is greatly reduced. Under the influence of the personalization and popularity of global communication, it is common that one person holds one or more cell phone(s). Due to the communication requirements between parents and children, even the pupils that just enter elementary schools hold the cell phones, so the cell phone-consuming age group is going to fall into the group of children less than 10 years old, and thus the demand for the cell phone is greatly increased. A research report based on topology of September 2005 has figured out that the total shipping number of the cell phone in 2005 all over the world is approximately 0.76 billion, and the number of the cell phone users goes up to 1.685 billion. The report also predicts that in 2009, the number of the cell phone users all over the world will go up to 2.236 billion. Therefore, the scale of the application market of the cell phone is quite large.

For the product attribute and design concept of cell phone, in addition to conversation and basic functions, the cell phone has additional functions, such as image communication, wireless data transmission, network connection, time display, alarm clock, notebook, world time zone, e-mail, personal secretary, GPS navigation, satellite positioning and searching, electronic map, wireless remote control, MP3 music, real-time image, digital photographing, digital program receiving, horizontal elevation, monitor alarm, digital game, radio, memory, etc. Due to the expansion requirement of the function, the number of the elements and the possibility of the integration of the elements in the cell phone are greatly increased. Unfortunately, impelled by the light in weight and small in size" requirement, the volume of the cell phone cannot be increased with the increase of the functions of the cell phone. Further, due to the sale point of light and chic, the size of the cell phone may be limited in a certain scope, and even the profile is further reduced. On the other hand, the cell phone is a common product in the global market, so the overall cost will be limited in a reasonable scope, and cannot be sold at high unit price like high-tech instruments or fittings. The overall cost of the elements installed in the cell phone will challenge the design. Therefore, the low cost and consistent production has become a design rule and principle for the elements in the cell phone, and it is the trend of the technical research.

In addition, for future cell phones, the requirements for sensing the environment information, such as temperature, humidity, volatile organic compound (VOC), carbon oxide toxic gas, ultraviolet strength, content of oxygen in the air, content of ammonia in the air, will be integrated into the cell phones. Therefore, it is necessary to develop a miniaturized sensing mechanism. The differential pressure sensing device is the only optimal possible approach at present. Currently, in cell phones, a certain amount of elements has adopt MEMS elements, such as microphones of speakers, micro-gyros for game effect, CCDs for photographing, and the possible sensing devices of the future cell phones, such that the MEMS sensing device plays an important role in the future cell phones. The size of the sensing device after packaged is required to be miniaturized to the maximum extent.

In the cost architecture of the MEMS sensing device, the package cost usually takes up 70% to 80% of the overall cost of the sensing device, so in order to reduce the cost of the sensing device, the package cost must be firstly considered, and is also a most effective and important direction of improvement.

For the common sensing device, in order to make the sensing mechanism on the device surface communicate with the outside atmosphere after the device is packaged to achieve the objective of sensing the environment, it is necessary to form a channel above the sensing region of the surface of the sensing device. In a known sensing device package, for example, disclosed in U.S. Pat. No. 6,379,988 B1, referring to FIG. 1A, a differential pressure sensing device package 10 is provided. Before the molding of the sensing device 11, a sacrificial protection layer 13 is covered on the surface of the sensing device in order to protect a micro-sensing or stopping structure 12 of the upper surface of the sensing device 11. The sacrificial protection layer 13 after the molding process is entirely embodied in the molding material 14, so it is necessary to open a window above the micro-sensing or stopping structure 12. The method of opening the window is as shown in FIGS. 1B and 1C, in which the spray etching using different strong acid is performed twice. Firstly, a first pad 15 is loaded on the molding material 14 to confine the region of the acid spray process. Then, a first strong acid 16 is sprayed for an appropriate time controlled for acid etching, so as to etch and remove the molding material 14 in contact with the first strong acid 16, such that the sacrificial protection layer 13 is exposed. Then, a second pad 17 is loaded on the first opening area of the molding material 14, and a second strong acid 18 is sprayed for an appropriate controlled time for acid etching, so as to etch and remove the sacrificial protection layer 13 to release the micro-sensing or stopping structure 12 of the sensing device 11 to contact the atmosphere.

However, the process of the differential sensing device package 10 of the conventional art has obvious defects. Firstly, in consideration of the method for opening the window, the conventional art adopts the strong acid spray etching technique. By the use of different strong acid materials and different pad shapes, the first layer of molding material 14 and the second layer of sacrificial protection layer 13 are opened. The strong acid process needs additional acid etching pads, and it is not easy to control the acid etching parameters, such that the yield is not high and also the problems of industrial safety and environment pollution exist. The strong acid process is used to process one by one, and the throughput is quite low. Further, in the conventional art, the sacrificial protection layer 13 must be used to entirely cover the surface and then expose the wire bonding area, so the complex patterns and processes will affect the yield of the wire bonding process.

SUMMARY OF THE INVENTION

In view of the above disadvantages, the present invention is a method of fabricating a plastic package of a differential pressure sensing device and a structure thereof, such that when the window is opened above the active area of the differential pressure sensing device, the layer can be naturally decomposed, which will not contaminate the environment and damage the original molding material.

The present invention, the present invention provides a method of fabricating the differential pressure sensing device package, which includes the following steps. A carrier having a surface and a through-hole is provided. Next, at least one differential pressure sensing device is provided, in which the differential pressure sensing device has an active surface and a back surface, the active surface has an active region and a plurality of bonding pads, and the back surface has a recess. Then, a photoresist process is performed to form a sacrificial layer on the active region. Afterwards, the differential pressure sensing device is bonded to the surface of the carrier and is electrically connected with the carrier. Then, at least one molding compound is formed to encapsulate the carrier and the differential pressure sensing device, and the molding compound exposes the upper surface of the sacrificial layer and the through-hole region of the carrier. Then, a solvent is used to naturally decompose the sacrificial layer, so as to expose the active region of the differential pressure sensing device.

The present invention further provides a plastic package of the differential pressure sensing device. The plastic package includes a carrier; at least one differential pressure sensing device disposed on the carrier and having an active surface with an active region and a plurality of bonding pads; a molding compound encapsulating the carrier, the differential pressure sensing device, and the bonding pads of the differential pressure sensing device etc., and having an opening on the active region of the differential pressure sensing device to expose the active region and make the active region be in communication with an external environment.

In the plastic package of the differential pressure sensing device, a dust-proof isolating filer is disposed on the active region of the differential pressure sensing device and bonded to the molding compound.

The functions of the implementation of the embodiments of the present invention are described as follows. When the window is opened above the active region of the surface of the differential pressure sensing device, no pad is required, such that the manufacturing method is greatly simplified. The integral processing can be adopted to open window on a plurality of differential pressure sensing devices, thus greatly improving the throughput and increasing the yield of the open window process. In the present invention, no strong acid spray etching process is used, so the problems that the acid etching parameters and etching time cannot be easily controlled and the environmental pollution and industrial safety accident occur due to the acid liquor leakage are eliminated. Also, in the present invention, a through-hole corresponding to the recess of the differential pressure sensing device is further disposed on the carrier, such that it can be used together with the differential pressure sensing device having particular functions to provide particular functions. In addition, in the present invention, during the open window process, the part outside of the active region of the differential pressure sensing device will not be affected, thus preventing the occurrence of poor electrical coupling of the bonding pads of the differential pressure sensing device and the carrier.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus is not limitative of the present invention, and wherein.

DETAILED DESCRIPTION OF THE INVENTION

Figure 1A:
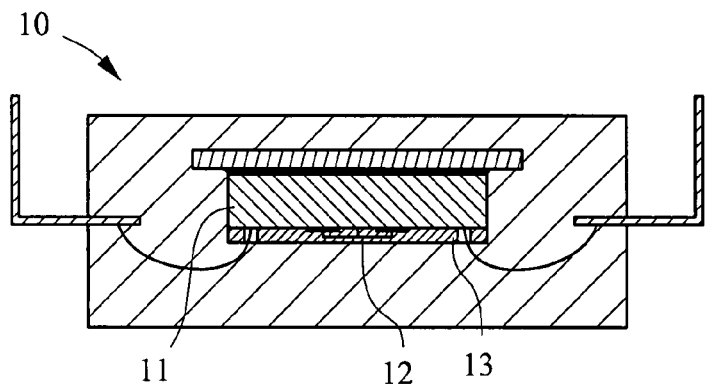
FIGS. 1A to 1C are schematic flow charts of a method of fabricating an opening for an active region of a sensing device of the conventional art.
Figure 1B:
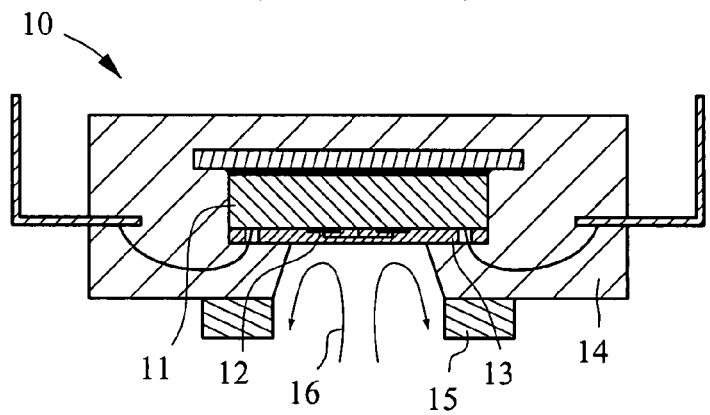
Figure 1C:
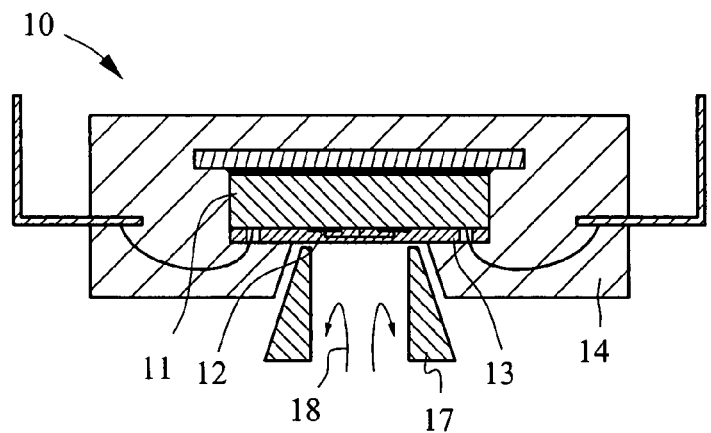
Figure 2A:
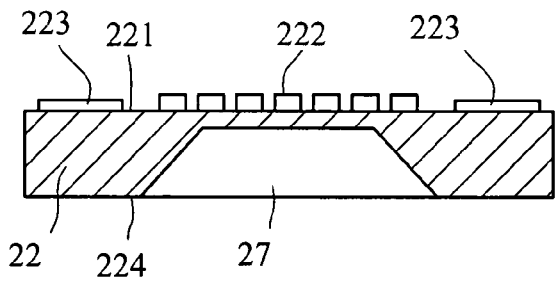
FIGS. 2A to 2G are schematic flow charts of a method of fabricating a differential pressure sensing device package according to the embodiments of the present invention.
Figure 2B:
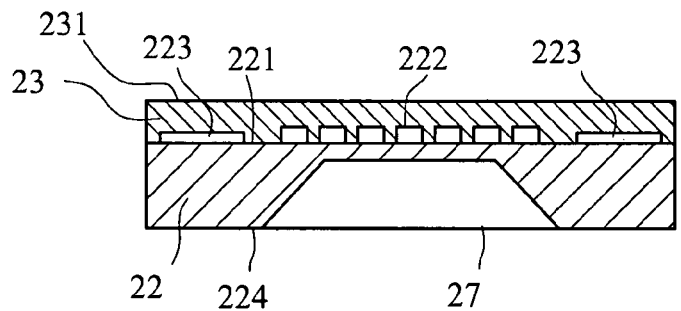
Figure 2C:
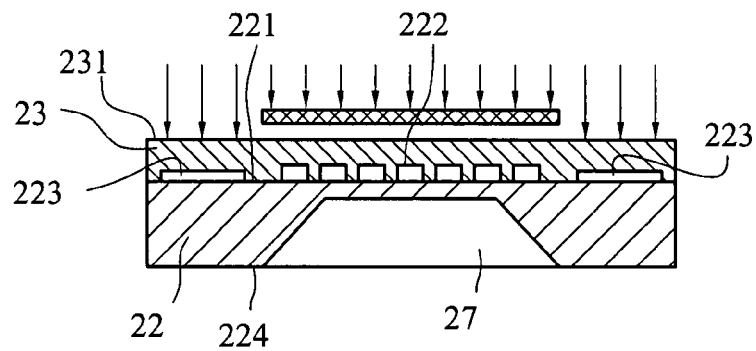
Figure 2D:
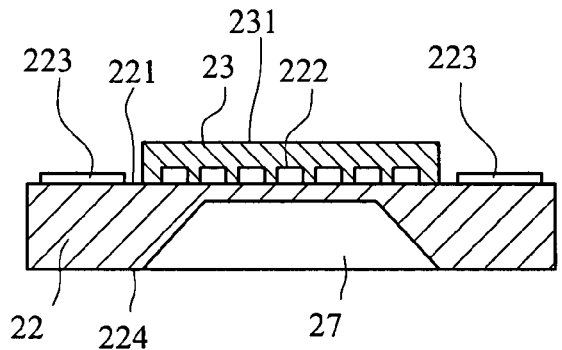
Figure 2E:
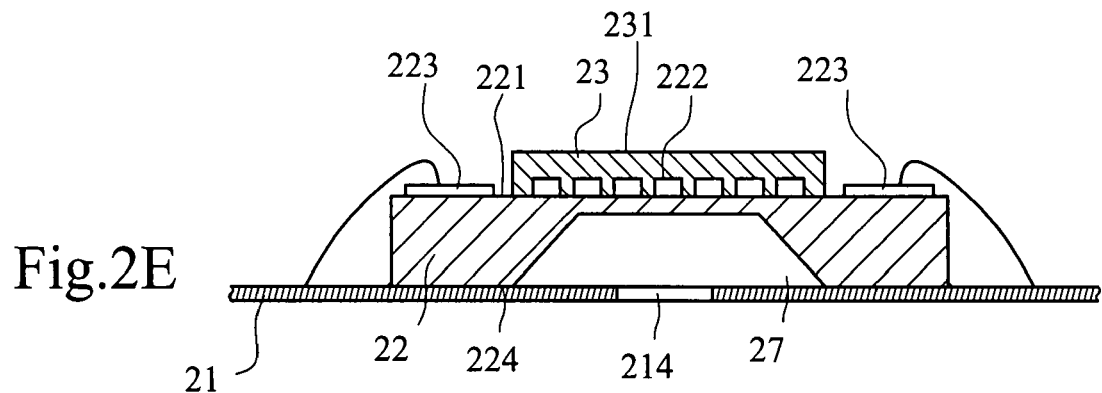
Figure 2F:
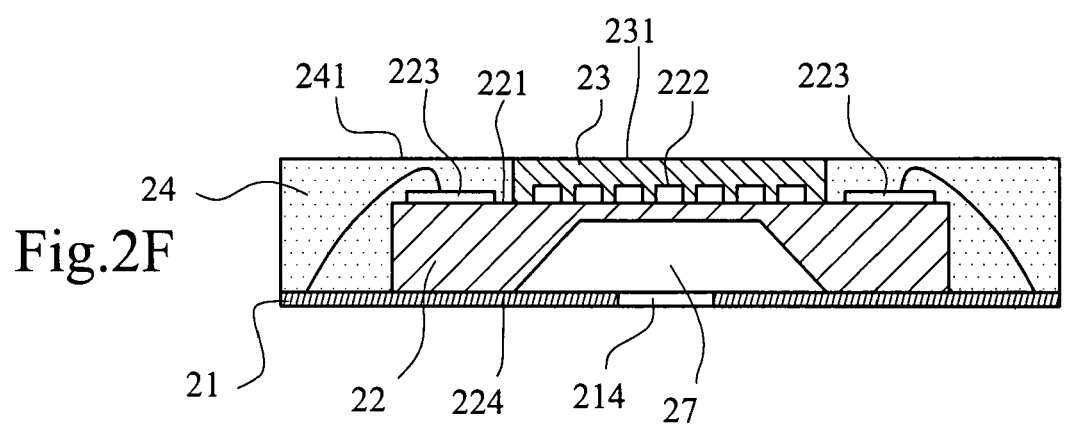
Figure 2G:
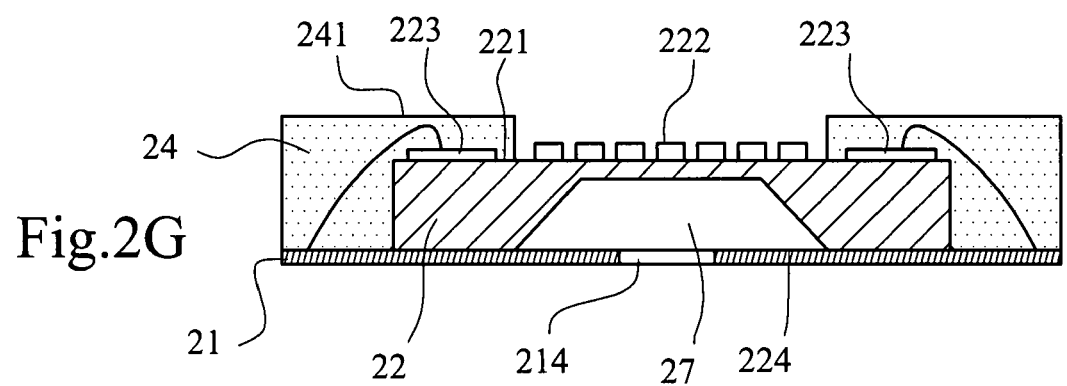

The preferred embodiments of the present invention will be illustrated in detail in accompanying with the drawings.

Referring to FIGS. 2A to 2G, the fabricating method includes the following steps. Firstly, a plurality of differential pressure sensing devices 22 each having an active surface 221 and a back surface 224 is provided. The active surface 221 has an active region 222 and a plurality of bonding pads 223, and the back surface 224 has a recess 27.

After that, a photoresist process is performed to form a sacrificial layer 23 on the active region 222, so as to avoid damaging the active region 222 during the subsequent molding operation. The sacrificial layer 23 may be a photosensitive high molecular material, such as SU-8 photoresist. The method of coating the active region is a spin coating method to form a photoresist layer (i.e. the sacrificial layer 23) with a uniform thickness or a screen printing method using the screen mask.

Next, a carrier 21 having a surface and a plurality of through-holes 214 is provided. The carrier 21 can be a PCB, a lead frame, or another substrate type.

Then, the back surfaces 224 of the differential pressure sensing devices 22 are bonded to the surface of the carrier 21. Each recess 27 is corresponding to the position of each through-hole 214, and the bonding pads 223 on the active surface 221 of the differential pressure sensing device 22 are electrically coupled with the carrier 21. In this embodiment, the wire bonding method is taken as an example for illustration.

At least one molding compound 24 is formed by transfer molding, radial-spray coating, or reaction-injection molding (RIM) etc. The material of the molding compound 24 is a liquid organic compound obtained by filling in liquid droplets and heat curing the liquid droplets, or a compound obtained by heating and liquidizing a solid and then filling and curing. The surface of the molding compound 24 exposes the upper surface 231 of the sacrificial layer 23.

Next, a solvent is used to naturally decompose the sacrificial layer 23, such that the active region 222 of the differential pressure sensing device 22 is exposed to the air. The solvent is determined according to the selected photosensitive high molecular material. For example, the acetone solution of organic material can be mainly selected, which is featured in that the removing of the sacrificial layer 23 depends on breaking the molecular bonds instead of the chemical etching principle using strong acid. The solvent only reacts with the sacrificial layer 23, so the sensing material of the differential pressure sensing device and the material of the molding compound 24 are not etched.

Finally, a sawing process is performed, so as to form a plurality of differential pressure sensing device packages.

Figure 3A:
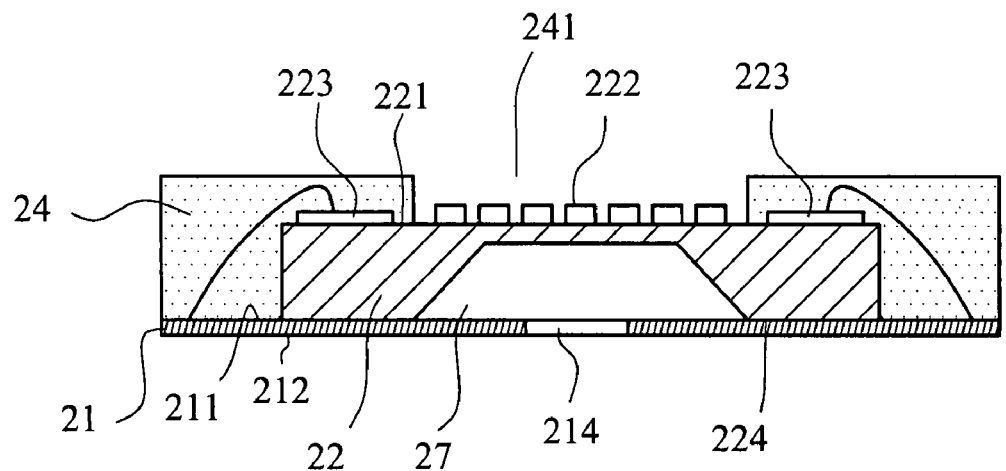
FIG. 3A is a cross-sectional view of a PCB carrier of the differential pressure sensing device package according to an embodiment of the present invention.
Figure 3B:
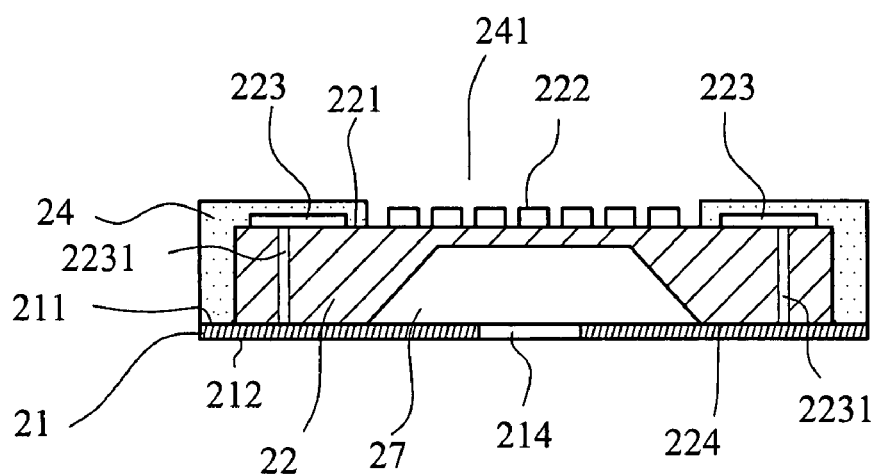
FIG. 3B is a cross-sectional view of a penetrating hole to achieve electrical coupling applied in FIG. 3A according to an embodiment of the present invention.

Referring to FIG. 3A, the package of the present invention includes a carrier 21, at least one differential pressure sensing device 22, and a molding compound 24. The carrier 21 has an upper surface 211, a lower surface 212, and a through-hole 214. The differential pressure sensing device 22 is bonded to the upper surface 211 of the carrier 21 and is electrically coupled with the carrier 21. The bonding is achieved by the use of silicone sealant or high polymer adhesive method etc. The electrical bonding can be achieved by gold wire bonding; directly opening a conductive via 2231 at the position of the bonding pad 223 of the differential pressure sensing device 22 to electrically coupling the carrier 21, thus reducing the package volume (as shown in FIG. 3B); or a flip chip bonding. The differential pressure sensing device 22 has an active surface 221 and a back surface 224. The active surface 221 has an active region 222 and at least one bonding pad 223. The back surface 224 has a recess 27 corresponding to the through-hole 214 of the carrier 21 and in communication with an external environment. The molding compound 24 encapsulates the upper surface 211 of the carrier 21, the differential pressure sensing device 22, and the bonding pad 223 area of the differential pressure sensing device 22. The molding compound 24 is merely disposed on the upper surface 221 of the carrier 21 and does not exist on the lower surface of the carrier. An opening 241 is formed above the active region 222 of the differential pressure sensing device 22, so as to expose the active region 222 of the differential pressure sensing device 22 and for the differential pressure sensing device 22 to active with the external environment. The molding compound material is a liquid organic compound obtained by filling in liquid droplets and heat curing the liquid droplets, or a compound obtained by heating and liquidizing a solid and then filling and curing.

Figure 4:
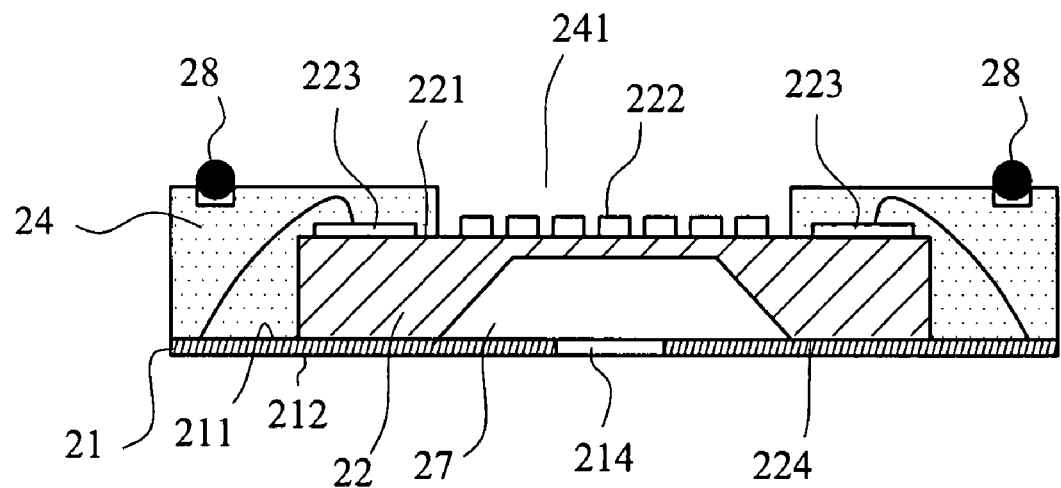
FIG. 4 is a cross-sectional view of a molding compound of the packaging structure of the differential pressure sensing device loaded with an O-ring according to an embodiment of the present invention.

The carrier 21 of the above embodiment may be a PCB. The applied package is as shown in FIG. 4, in which an O-ring 28 is loaded on the molding compound 24.

Figure 5:
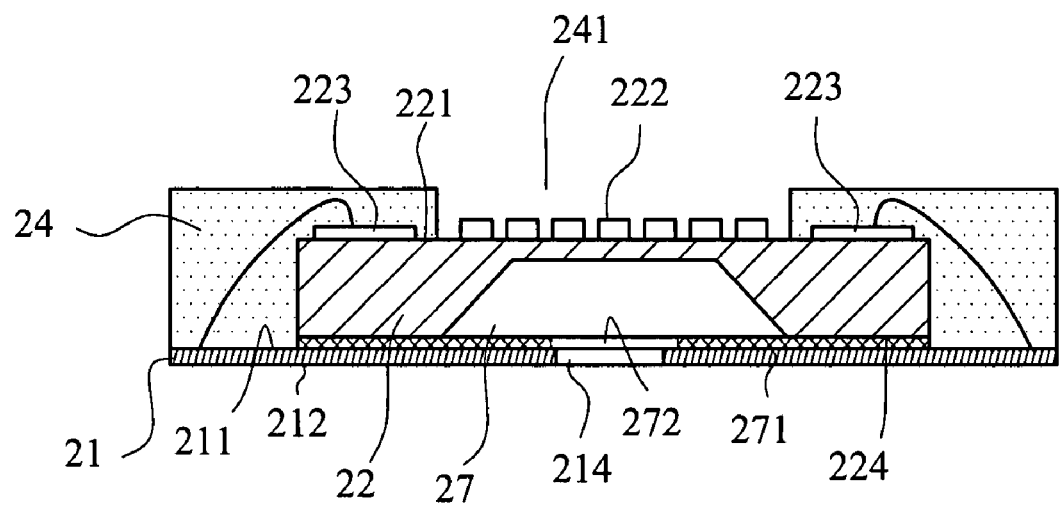
FIG. 5 is a cross-sectional view of a support structure layer with holes added in FIG. 3A according to an embodiment of the present invention.

As shown in FIG. 5, in the above embodiment, the back surface 224 of the differential pressure sensing device 22 further includes a support structure layer 271 bonded thereon. The support structure layer 271 covers the whole back surface 224, and has a hole 272 corresponding to the position of the recess 27 of the differential pressure sensing device 22. The recess 27 is formed on the back surface 224, such that the strength of the differential pressure sensing device 22 is greatly weakened and it may be easily damaged during the surface adhering and packaging process; therefore, the support structure layer 271 can reinforce the rigid strength of the differential pressure sensing device 22, so as to improve the yield of products. The hole 272 cooperates with the differential pressure sensing device 22. The material of the support structure layer 271 is a rigid material including glass, silicon wafer, metal, or reinforced plastic sheet, etc. The method of bonding the support structure layer 271 and the back surface 224 of the differential pressure sensing device 22 can be wafer bonding, adhesive coating, or preformed adhesive film hot pressing etc.

Figure 6:
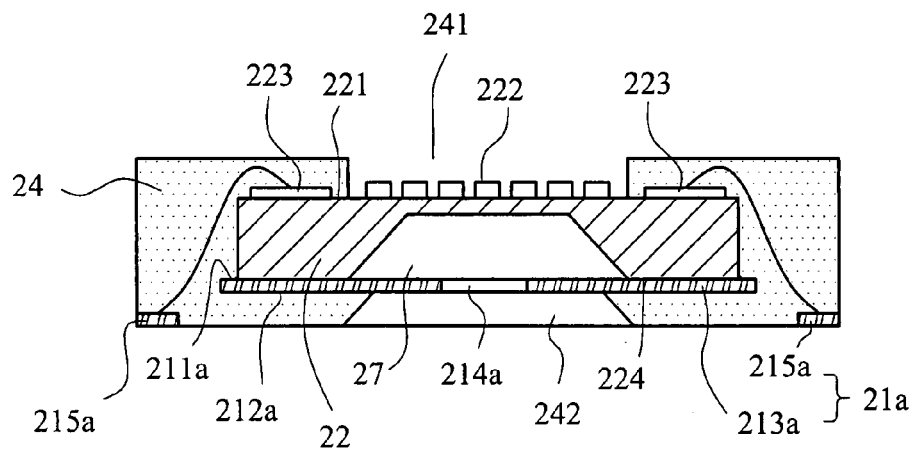
FIG. 6 is a cross-sectional view of a lead frame carrier of the packaging structure for the differential pressure sensing device according to an embodiment of the present invention.

Further, referring to FIG. 6, the difference of this embodiment and the above embodiments lies in that the carrier 21 is a lead frame 21a having a chip pad 213a and a plurality of pins 215a. The chip pad 213a has an upper surface 211a, a lower surface 212a, and a through-hole 214a. The differential pressure sensing device 22 is bonded to the upper surface 211a of the chip pad 213a and is electrically coupled with the pins 215a. The differential pressure sensing device 22 has an active surface 221 and a back surface 224, the active surface has an active region 222 and at least one bonding pad 223. The back surface 224 has a recess 27 corresponding to the through-hole 214a of the lead frame 21a. The molding compound 24 encapsulates the chip pad 213a and the pins 215a of the lead frame 21a, the differential pressure sensing device 22, and the bonding pad 223 area. An opening 241 is disposed above the active region 222 of the differential pressure sensing device 22, so as to expose the active region 222 of the differential pressure sensing device 22. The lower surface of the chip pad 213a of the lead frame 21a also has a bottom opening 242 to expose the through hole 214a.

Figure 7:
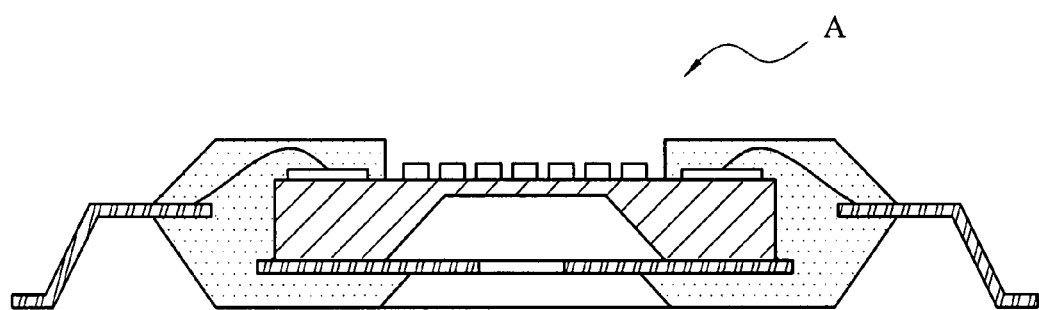
FIG. 7 is a cross-sectional view of the miniaturized package of the lead frame carrier of the differential pressure sensing device package according to an embodiment of the present invention.
Figure 8:
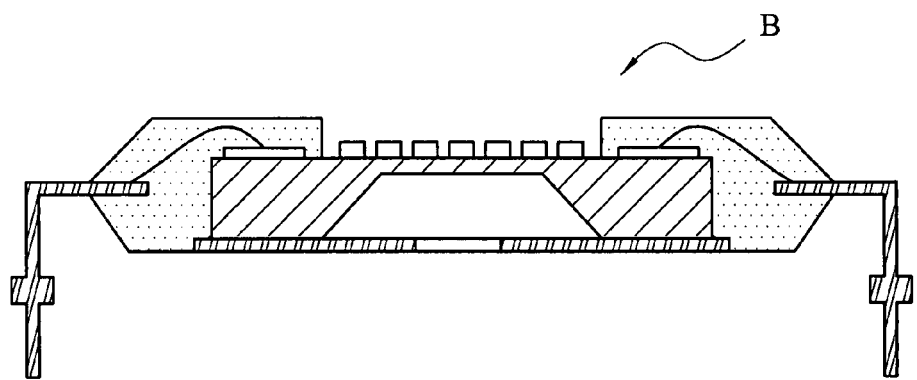
FIG. 8 is a cross-sectional view of a flat through-hole form of the lead frame carrier of the differential pressure sensing device package according to an embodiment of the present invention.

Definitely, the above embodiment using the lead frame 21a as the carrier 21 may be implemented in other aspects, for example, an embodiment A applied to SOP miniaturized packaging as shown in FIG. 7, or an embodiment B applied to the flat bottom through-hole as shown in FIG. 8.

In the embodiments of FIGS. 6, 7 and 8, the back surface 224 of the differential pressure sensing device 22 can also have an implementation aspect of disposing a support structure layer 271 having a hole 272 (referring to FIG. 5) corresponding to the recess 27 position of the differential pressure sensing device 22, so as to meet the particular functional requirements of the differential pressure sensing device 22.

Figure 9:
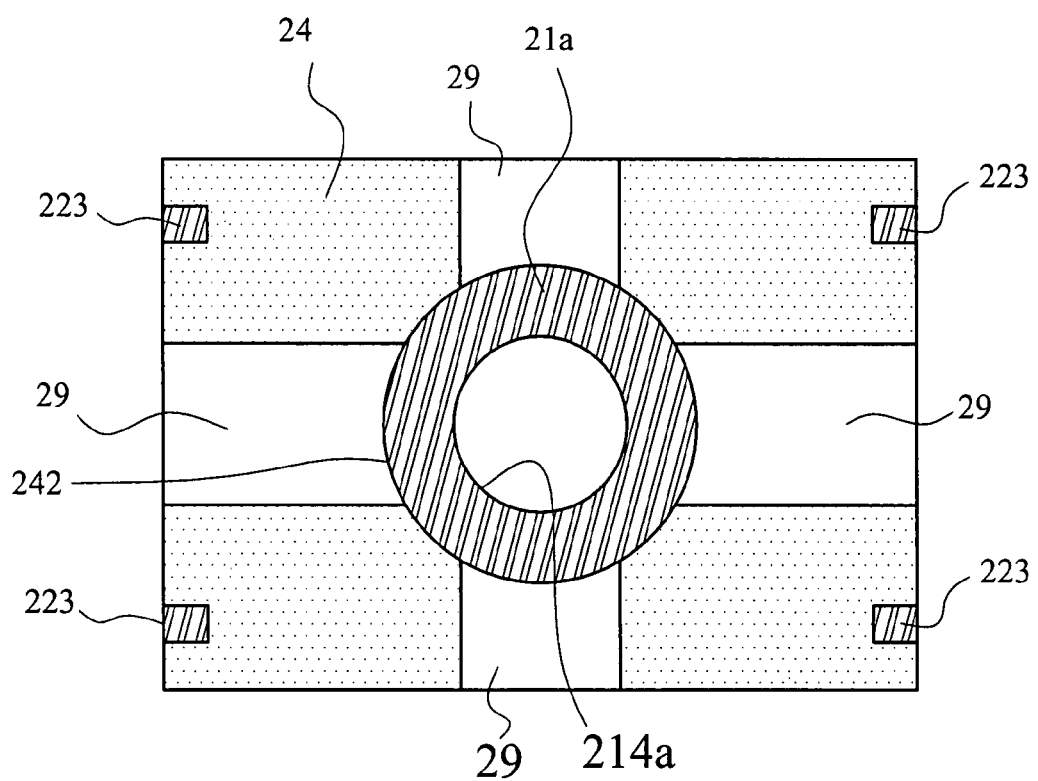
FIG. 9 is a bottom view of an exhaust trench formed on the bottom of FIG. 6 according to an embodiment of the present invention.

In addition, FIG. 9 is a cross-sectional view of an exhaust trench formed on the bottom of FIG. 6 according to an embodiment of the present invention. On the bottom surface of the molding compound 24, at least one exhaust trench 29 is disposed from the bottom opening 242 to the edge of the molding compound 24, so as to accord with the practical operation of the differential pressure sensing device 22.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A differential pressure sensing device package, comprising:
   a carrier, having a upper surface, a lower surface, and a through-hole;
   at least one differential pressure sensing device, bonded and electrically coupled with the upper surface of the carrier, having an active surface with a active region and at least one bonding pad and a back surface with a recess corresponding to the through-hole of the carrier and being in communication with an external environment; and
   a molding compound, encapsulating the upper surface of the carrier, the differential pressure sensing device, and a bonding pad area of the differential pressure sensing device; the molding compound having an opening above the active region of the differential pressure sensing device to expose the active region of the differential pressure sensing device and make the active region be in communication with the external environment, wherein the opening is defined and surrounded by an innermost sidewall of the molding compound, and the innermost sidewall of the molding compound extends directly from the active surface of the differential pressure sensing device.

2. The differential pressure sensing device package as claimed in claim 1, wherein the carrier is a printed circuit board (PCB).

3. The differential pressure sensing device package as claimed in claim 1, wherein the back surface of the differential pressure sensing device further comprises a support structure layer bonded thereon, the support structure layer covering the back surface of the differential pressure sensing device and having a hole corresponding to a position of the recess of the differential pressure sensing device.

4. The differential pressure sensing device package as claimed in claim 3, wherein material of the support structure layer is a rigid material selected from a group consisting of glass, silicon wafer, metal, and reinforced plastic sheet.

5. The differential pressure sensing device package as claimed in claim 3, wherein a binding means of the support structure layer is wafer bonding, adhesive coating, or preformed adhesive film hot pressing.

6. The differential pressure sensing device package as claimed in claim 1, wherein the bonding means of the differential pressure sensing device and the surface of the carrier comprises using silicone sealant or polymer adhesive.

7. The differential pressure sensing device package as claimed in claim 1, wherein material of the molding compound is a liquid organic compound obtained by filling liquid droplets and heat curing the liquid droplets, or a compound obtained by heating and liquidizing a solid and then filling and curing.

8. The differential pressure sensing device package as claimed in claim 1, wherein the mold compound is merely disposed on the upper surface of the carrier and not existed on the lower surface of the carrier.

* * * * *